(12) United States Patent
Kim et al.

(10) Patent No.: US 10,096,760 B2
(45) Date of Patent: Oct. 9, 2018

(54) SEMICONDUCTOR DEVICE PACKAGE

(71) Applicant: LG INNOTEK CO., LTD., Seoul (KR)

(72) Inventors: Eun Joo Kim, Seoul (KR); Ga Yeon Kim, Seoul (KR); Nak Hun Kim, Seoul (KR); Jung Hwan Son, Seoul (KR); Young Hyun Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/822,289

(22) Filed: Nov. 27, 2017

(65) Prior Publication Data

US 2018/0151790 A1 May 31, 2018

(30) Foreign Application Priority Data

Nov. 25, 2016 (KR) ........................ 10-2016-0158043

(51) Int. Cl.
| | |
|---|---|
| *F21V 5/00* | (2018.01) |
| *H01L 33/64* | (2010.01) |
| *F21V 5/04* | (2006.01) |
| *H01L 33/60* | (2010.01) |
| *H01L 33/62* | (2010.01) |
| *H01L 33/38* | (2010.01) |
| *H01L 33/58* | (2010.01) |
| *F21Y 115/10* | (2016.01) |
| *H01L 33/50* | (2010.01) |

(52) U.S. Cl.
CPC .............. *H01L 33/647* (2013.01); *F21V 5/04* (2013.01); *H01L 33/38* (2013.01); *H01L 33/58* (2013.01); *H01L 33/60* (2013.01); *H01L 33/62* (2013.01); *H01L 33/644* (2013.01); *F21Y 2115/10* (2016.08); *H01L 33/505* (2013.01)

(58) Field of Classification Search
CPC ... H01L 2924/00014; H01L 2924/0002; H01L 2924/00; H01L 2224/48091
USPC ........... 362/249.02, 800, 84, 97.1, 231, 235, 362/311.02
See application file for complete search history.

(56) References Cited

U.S. PATENT DOCUMENTS

2012/0193665 A1   8/2012 Yamada
2012/0262941 A1*  10/2012 Min .................... H01L 25/0753
                                                     362/607

(Continued)

FOREIGN PATENT DOCUMENTS

EP            2482346            8/2012

OTHER PUBLICATIONS

European Search Report dated Mar. 23, 2018 issued in Application No. 17203490.2.

*Primary Examiner* — Jamara Franklin
(74) *Attorney, Agent, or Firm* — KED & Associates, LLP

(57) ABSTRACT

A semiconductor device package and a lighting device including a semiconductor device package are provided. The semiconductor device package may include a substrate, a first electrode module provided on the substrate, a light emitting device provided in a first region of the first electrode module, a second electrode module electrically disconnected from the first electrode module and provided on the substrate, and an insulating reflection layer provided on a circumference of the light emitting device between the first electrode module and the second electrode module and having a polygonal shape.

20 Claims, 10 Drawing Sheets

(56) References Cited

U.S. PATENT DOCUMENTS

2015/0188011 A1 7/2015 Kang
2015/0311249 A1 10/2015 Weng et al.
2016/0087149 A1* 3/2016 Miyachi ............. H01L 25/0753
                                                      362/509

* cited by examiner

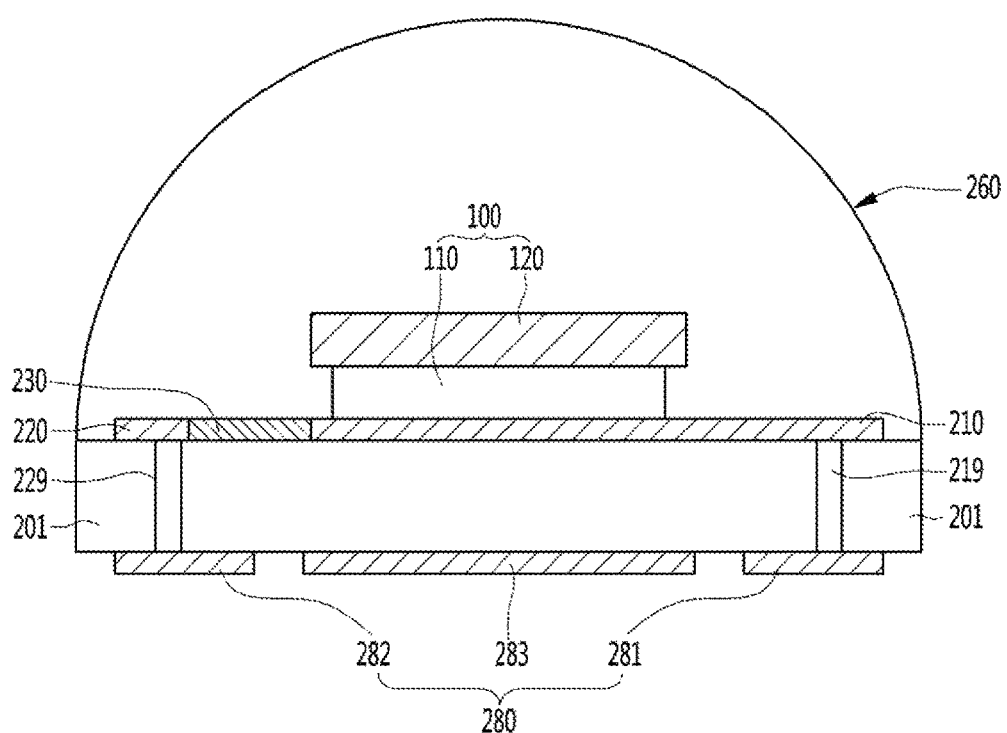

SEMICONDUCTOR DEVICE PACKAGE

CROSS-REFERENCE TO RELATED APPLICATION

This application claims priority under 35 U.S.C. § 119 to Korean Application No. 10-2016-0158043 filed on Nov. 25, 2016, whose entire disclosure is incorporated herein by reference.

BACKGROUND

1. Field

Embodiments provide a semiconductor device package and a lighting device including a semiconductor device package.

2. Background

Semiconductor devices, which may include a compound such as GaN or AlGaN, have energy bandgaps that may be wide and easy to control, and thus, may be variously used as light emitting devices, light receiving devices, and different kinds of diodes. Light receiving devices, such as, e.g., light emitting diodes (LEDs) or laser diodes using Group III-V or II-VI compound semiconductor materials may emit various colors, such as, e.g., red, green, blue, and ultraviolet (UV) due to development of thin film growth technology and device materials, may emit white light having good efficiency by using fluorescent materials or combining colors, and may have low power consumption, a semi-permanent lifetime, a fast response time, safety, and environmental affinity in comparison with, for example, fluorescent lamps and incandescent lamps.

If a light receiving device such as a light detector or a solar cell is manufactured by using Group III-V or II-VI compound semiconductor materials, due to development of device materials, the light receiving device may absorb light having various wavelength ranges to generate a light current, and thus, may use light having various wavelength ranges including gamma ray to a radio wavelength ranges. Since the light receiving device may have a fast response time, safety, and environmental affinity and may be easy to adjust device materials, the light receiving device may be easily applied to, for example, power control circuits, ultra-high frequency circuits, or communication modules.

Therefore, application of such light receiving devices may include, for example, transmission modules for a light communication means, LED backlights with which cold cathode fluorescent lamps (CCFLs) configuring a backlight of a liquid crystal display (LCD) device may be replaced, white LED lighting devices with which fluorescent lamps and incandescent lamps may be replaced, vehicle headlights, signal lights, and sensors to sense gas or fire. Application of the light receiving devices may also include use in, for example, high frequency application circuits, other power control devices, and communication modules.

In light emitting devices, a P-N junction diode that converts electrical energy into light energy may be manufactured by combining periodic table Group III-V elements or II-VI elements, and various colors may be emitted by adjusting a combination ratio of compound semiconductors. For example, nitride semiconductors are attracting attention in development field of light devices and high output electronic devices due to high thermal stability and energy having a wide bandgap. Blue light emitting devices, green light emitting devices, UV light emitting devices, and red light emitting devices using nitride semiconductors have been commercialized and may be widely used.

For example, UV LEDs are LEDs that emit light distributed in a wavelength range of 200 nm to 400 nm. A short wavelength of the wavelength range may be applied to sterilization and purification, and a long wavelength may be applied in exposure equipment and curing equipment.

Products using LEDs are being researched and released, and use of LEDs as light sources of lighting devices, such as, e.g., various lamps, LCD devices, electronic display boards, street lamps, and headlights used at indoor and outdoor places is increasing. A light emitting chip using an LED may be provided on a substrate including a lead frame, and a plating layer for light reflection may be provided on the substrate.

However, the plating layer of the substrate may have a problem where light speed may be reduced due to discoloration. Electrical reliability may be reduced due to discoloration of the plating layer of the substrate. Moreover, electrical reliability may be reduced due to a disconnection of a wire that electrically connects a light emitting device and the lead frame. Reliability may also be reduced due to reduction in a coupling force between an optical lens and the substrate. Electrical reliability may be reduced due to an issue of thermal dissipation of a package substrate.

BRIEF DESCRIPTION OF THE DRAWINGS

The embodiments will be described in detail with reference to the following drawings in which like reference numerals refer to like elements wherein:

FIG. 6C is another cross-sectional view taken along line III-III' of a semiconductor device package according to the embodiment;

DETAILED DESCRIPTION

Figure 1:
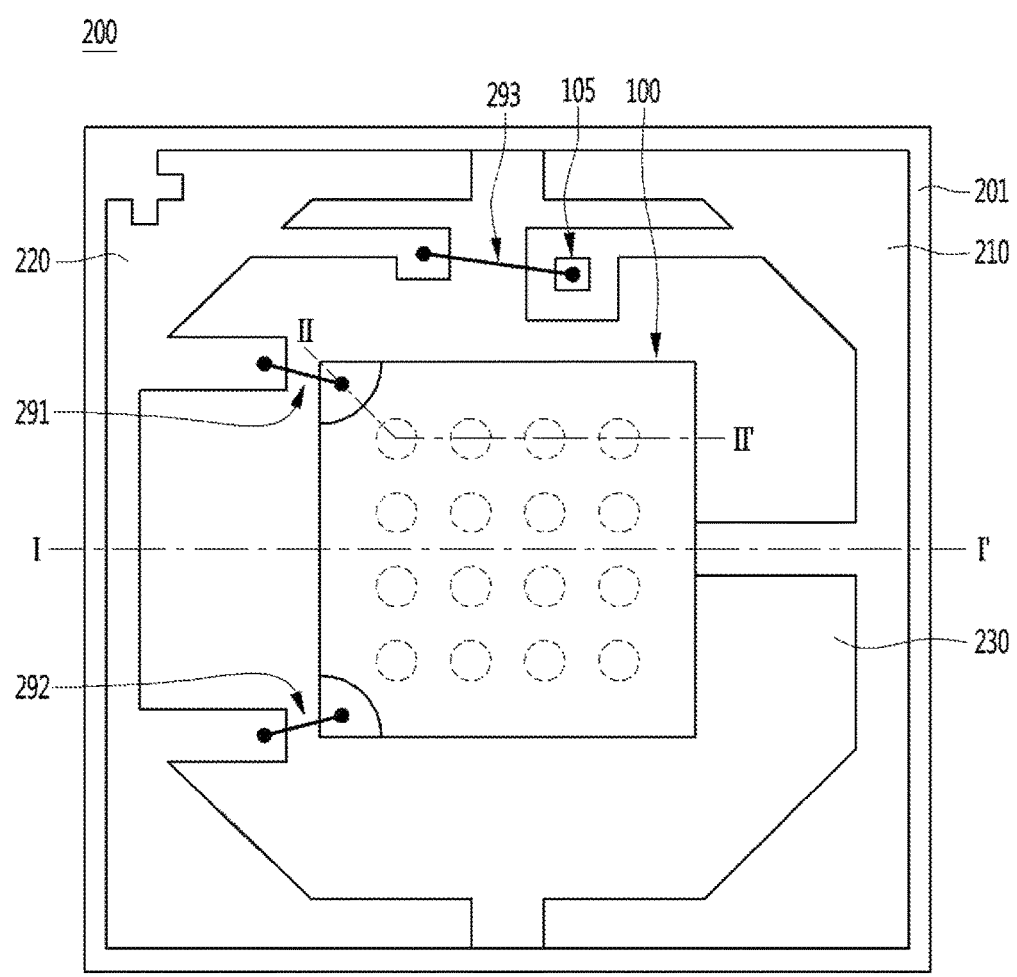
FIG. 1 is a plan view of a substrate and a light emitting device in a semiconductor device package according to an embodiment.

Referring to FIG. 1, a semiconductor device package 200 according to an embodiment may include a substrate 201 and a semiconductor device 100. The semiconductor device package 200 may include one or more of the substrate 201, the light emitting device 100, a first electrode unit or module 210, a second electrode unit or module 220, and an insulating reflection layer 230.

For example, referring to FIG. 1, the semiconductor device package 200 may include one or more of the first electrode unit 210 provided on the substrate 201, the light emitting device 100 provided on the first electrode unit 210, the second electrode unit 220 electrically separated from the first electrode unit 210 and provided on the substrate 201, and the insulating reflection layer 230 provided around the light emitting device 100 between the first electrode unit 210 and the second electrode unit 220 and having a polygonal shape.

The light emitting device 100 may be a vertical light emitting chip, but is not limited thereto. The light emitting device 100 may be electrically connected to the first electrode unit 210 and the second electrode unit 220. For example, a bottom of the light emitting device 100 may include a conductive substrate and may be provided on and electrically connected to the first electrode unit 210, and a top of the light emitting device 100 may be electrically connected to the second electrode unit 220 through first and second wires 291 and 292. However, embodiments are not limited thereto.

The semiconductor device package 200 may include a protection device 105 provided in a region of the first electrode unit 210. The protection device 105 may be electrically connected to a region of the second electrode unit 220 through a third wire 293. The protection device 105 may be implemented as, for example, a Zener diode, a thyristor, or transient voltage suppression (TVS), and may protect the light emitting device 100 from electro static discharge (ESD).

Figure 2:
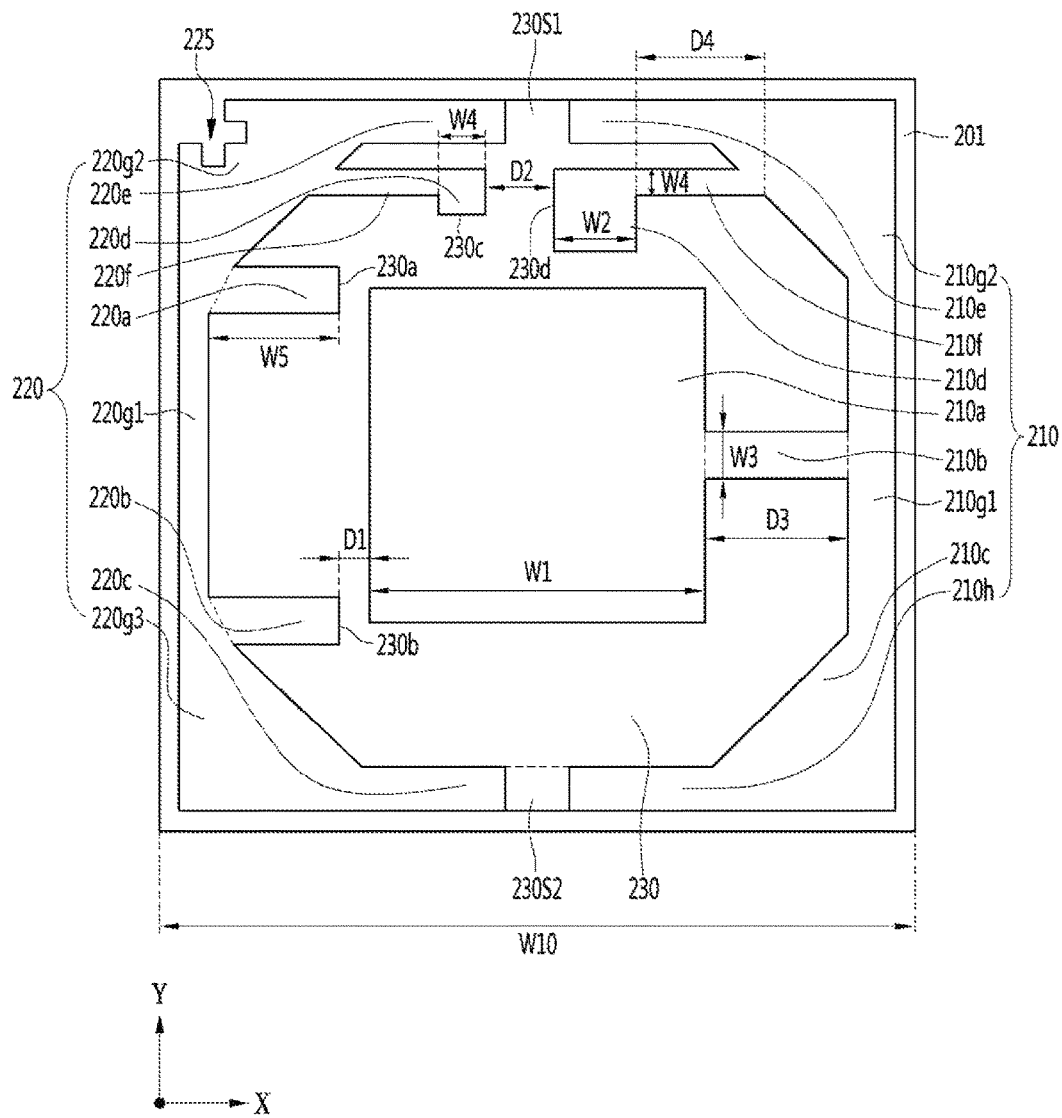
FIG. 2 is a plan view of a substrate in a semiconductor device package according to the embodiment.
Figure 3:
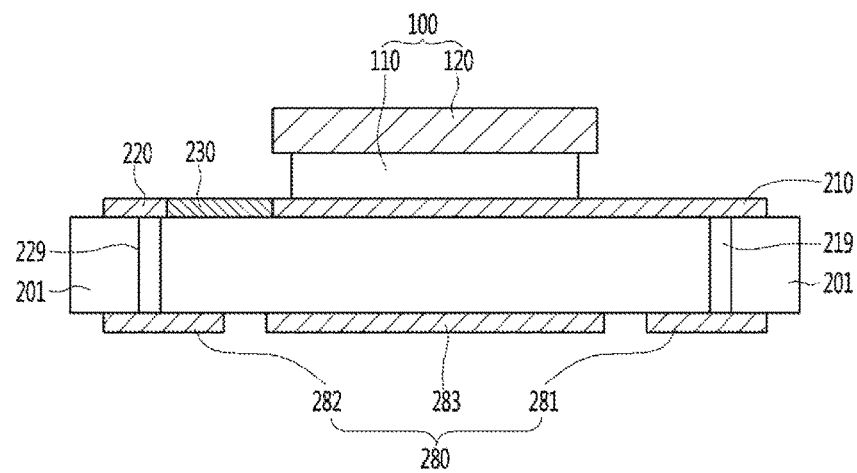
FIG. 3 is a cross-sectional view of a substrate and a light emitting device in a semiconductor device package according to the embodiment.
Figure 4:
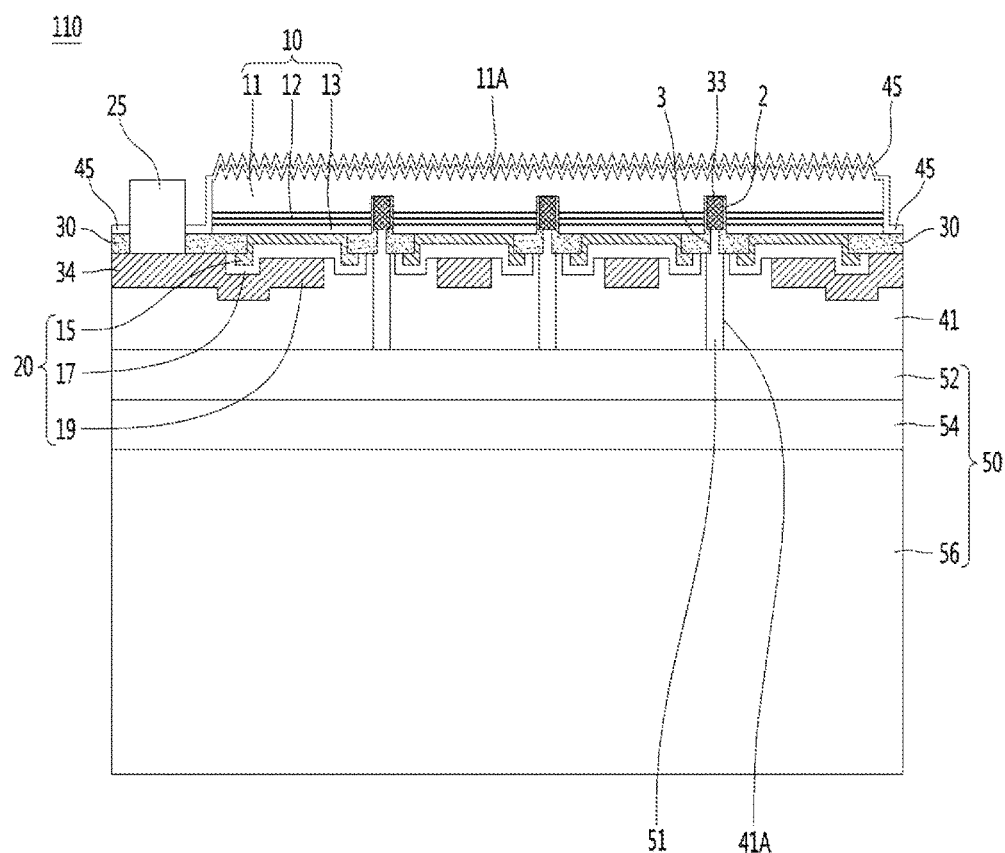
FIG. 4 is a cross-sectional view of a light emitting chip in a semiconductor device package according to the embodiment.

The semiconductor device package 200 may be described with reference to FIG. 1 to FIG. 4. FIG. 2 is a plan view of the substrate 201 from which the light emitting device 100 has been removed. FIG. 3 is a cross-sectional view taken along line I-I' in a substrate and a light emitting device in the semiconductor device package 200 according to FIG. 1. FIG. 4 is a cross-sectional view taken along line II-II' of a light emitting chip in the semiconductor device package 200 according to FIG. 1.

Referring to FIG. 2, the semiconductor device package 200 may include the first electrode unit 210 provided on the substrate 201 and the second electrode unit 220 electrically separated from the first electrode unit 201 and provided on the substrate 201. The substrate 201 may include a metal compound or an insulating material which may be good for thermal dissipation. For example, the substrate 201 may include low temperature co-fired ceramic (LTCC) or high temperature co-fired ceramic (HTCC). The substrate 201 may be formed of a resin-based insulating material, for example, resin such as polyphthalamide (PPA). The substrate 201 may be formed of, for example, silicon, epoxy resin, thermocurable resin including a plastic material, a high heat resistant material, or a high light resistant material.

The substrate 201 may include a metal compound, for example, nitride aluminum (AlN) or alumina ($Al_2O_3$). Alternatively, the substrate 201 may include metal oxide having thermal conductivity of 140 W/mk or more. The substrate 201 may include one or more of an anti-oxidation agent, a light reflecting agent, an inorganic charging agent, a curing catalyst, a light stabilizing agent, a releasing agent, and titanium dioxide.

Referring to FIG. 2, the substrate 201 may include a plane that includes a first side in a first axis (X) direction and a second side in a second axis (Y) direction vertical to the first axis (X) direction. For example, the plane of the substrate 201 may have a rectangular shape or a square shape, but is not limited thereto. The first side may be an abscissa side, and the second side may be an ordinate side. However the present embodiment is not limited thereto. A width W10 of the first side of the substrate 201 may be the same as that of the second side, but is not limited thereto. For example, the width W10 of the first side of the substrate 201 may be within a range of about 3 mm or 4 mm, but is not limited thereto.

Referring to FIG. 2, the semiconductor device package 200 may include the first electrode unit 210, including a first region 210a where the light emitting device 100 may be provided, and the second electrode unit 220 electrically separated from the first electrode unit 210 and provided on the substrate 201. The first electrode unit 210 and the second electrode unit 220 may each be formed of a single layer or a multilayer including one or more of titanium (Ti), copper (Cu), nickel (Ni), gold (Au), chromium (Cr), tantalum (Ta), platinum (Pt), tin (Sn), silver (Ag), and phosphorus (P). For example, silver (Ag) or aluminum (Al) may be provided on a surface of each of the first electrode unit 210 and the second electrode unit 220, and thus, a reflection efficiency of incident light may be enhanced, thereby increasing light efficiency. The first electrode unit 210 and the second electrode unit 220 may each include a metal layer, and thus, may prevent corrosion caused by water, thereby enhancing electrical reliability.

Referring to FIG. 1 and FIG. 2, the semiconductor device package 200 may include the insulating reflection layer 230 provided around the light emitting device 100 between the first electrode unit 210 and the second electrode unit 220 and having a polygonal shape. Due to a discoloration of a plating layer provided on a substrate, light reflection efficiency may be reduced, or electrical reliability may be reduced. In order to solve such problems, the semiconductor device package 200 according to an embodiment may include the insulating reflection layer 230 provided around the light emitting device 100 and having the polygonal shape, and the insulating reflection layer 230 may be provided between the first electrode unit 210 and the second electrode unit 220.

Since the semiconductor device package 200 includes the insulating reflection layer 230 provided around the light emitting device 100 between the first electrode unit 210 and the second electrode unit 220 and having a polygonal shape, a region of each of the first and second electrode units 220 and 230 where discoloration may occur may be minimized, and moreover, the insulating reflection layer 230, which may have good thermal and electrical reliability, may be provided around the light emitting device 100, thereby solving a problem where light speed may be reduced due to discoloration of a plating layer of a substrate and a problem where electrical reliability may be reduced due to a discoloration of a plating layer of a substrate.

The insulating reflection layer 230 may be formed of a single layer or a multilayer by using a thermocurable resin composition or a photosensitive resin composition and may include a light reflecting material such as titanium dioxide, but is not limited thereto. For example, the insulating reflection layer 230 may use resin which may be a thermocurable resin composition and may have electrical insulating properties through curing by heat, and the thermocurable resin may be an epoxy compound, silicon resin, an oxetan compound, or melamine resin. However, embodiments are not limited thereto. The insulating reflection layer 230 may be an alkaline developable photosensitive resin composition that includes a carboxylic group or a phenolic hydroxyl group and may be neutralized and dissolved by an alkaline developer.

Materials of the first and second electrode units 210 and 220 may be primarily formed in a region other than a region where a light emitting chip is to be formed on a substrate, and then, materials of the first and second electrode units may be removed from a region where the insulating reflection layer 230 is to be formed, whereupon the insulating reflection layer 230 may be formed. The materials of the first and second electrode units 210 and 220 may be formed in only the region where the insulating reflection layer 230 is to be formed, and the insulating reflection layer 230 may be formed in a region where the insulating reflection layer 230 is to be formed. Therefore, a height of each of the first and second electrode units 210 and 220 and a height of the insulating reflection layer 230 may be provided on a same horizontal surface, or the height of the insulating reflection layer 230 may be set differently from that of each of the first and second electrode units 210 and 220. The height of the insulating reflection layer 230 may be adjusted in consideration of thermal stability based on heat transferred from the first and second electrode units 210 and 220 to the insulating reflection layer 230.

Referring to FIG. 2, the first electrode unit 210 may include a first region 210a, where the light emitting device 100 may be provided, and a second region 210d where the protection device 105 may be provided. Also, the first electrode unit 210 may include a third region 210c, which may be located in a lower corner region of the first electrode unit 210 with respect to a second axis Y vertical to a first axis X, and a fourth region 210e, which may be located in an upper corner region of the first electrode unit 210. The first electrode unit 210 may include a fifth region 210b provided between the first region 210a and each of the third and fourth regions 210c and 210e.

The second electrode unit 220 may include a first protrusion 220a and a second protrusion 220b that protrude in a direction from a second side, for example, a left side of the substrate 201 in the second axis (Y) direction to the light emitting device 100 corresponding to the first axis (X) direction. The second electrode unit 220 may include a third protrusion 220d capable of being electrically connected to a third wire 293 to correspond to the second region 210d of the first electrode unit 210. The second electrode unit 220 may include a fourth protrusion 220c, which may be located in a lower corner region of the second electrode unit 220 with respect to the second axis Y, and a fifth protrusion 220e, which may be located in an upper corner region of the second electrode unit 220.

A polarity mark 225 may be provided in one of the first electrode unit 210 and the second electrode unit 220. For example, the polarity mark 225 may be provided in the upper corner region of the second electrode unit 220 so as to be differentiated from another corner region. The polarity mark 225 may be an anode mark or a cathode mark.

The insulating reflection layer 230 may include one or more recesses or one or more separation regions. For example, the insulating reflection layer 230 may include a first recess 230a, a second recess 230b, and a third recess 230c to respectively correspond to the first protrusion 220a, the second protrusion 220b, and the third protrusion 220c of the second electrode unit 220. The insulating reflection layer 230 may include a first separation region 230S1 between the fifth protrusion 220e of the second electrode unit 220 and the fourth region 210e of the first electrode unit 210 and a second separation region 230S2 between the fourth protrusion 220c of the second electrode unit 220 and the third region 210c of the first electrode unit 210 and may electrically separate the first electrode unit 210 from the second electrode unit 220.

An organic coupling relationship between the first electrode unit 210, the second electrode unit 220, and the insulating reflection layer 230 in the semiconductor device package 200 according to an embodiment is described with reference to FIG. 1 and FIG. 2. An area of the first region 210a of the first electrode unit 210 may be equal to or greater than that of the light emitting device 100, which may be subsequently provided, but is not limited thereto. The first region 210a of the first electrode unit 210 may have a polygonal shape. For example, the first region 210a of the first electrode unit 210 may have a rectangular shape or a square shape, but is not limited thereto.

A width W1 of the first region 210a of the first electrode unit 210 in the first axis (X) direction may be about two-fifths (2/5) to three-fifths (3/5) of the width W10 of the first side of the substrate 201 in the first axis (X) direction. A width of the first region 210a of the first electrode unit 210 in the second axis (Y) direction may be equal to or different from the width W1 in the first axis (X) direction.

For example, the width W1 of the first region 210a of the first electrode unit 210 in the first axis (X) direction may be about 1.2 mm to 2.4 mm, but is not limited thereto. When the width W1 of the first region 210a of the first electrode unit 210 in the first axis (X) direction is less than two-fifths (2/5) of the width W10 of the first side, a region on which the light emitting device 100 is mounted may not be appropriately secured, causing degradation in electrical reliability. When the width W1 of the first region 210a of the first electrode unit 210 in the first axis (X) direction is more than three-fifths (3/5) of the width W10 of the first side, the first region 210a of the first electrode unit 210 may be wider than the region on which the light emitting device 100 is mounted, causing reduction in thermal dissipation efficiency.

A first distance D1 between the first region 210a of the first electrode unit 210 and the first protrusion 220a or the second protrusion 220b of the second electrode unit 220 may be within a range of about one-tenth (1/10) to three-tenths (3/10) of the width W1 of the first region 210a of the first electrode unit 210 in the first axis (X) direction and may be secured by a short distance. For example, the first distance D1 may be about 0.12 mm to about 0.36 mm, but is not limited thereto.

Therefore, a length of each of a first wire 291 and a second wire 292 which electrically connect the light emitting device 100 and the second electrode unit 220 may be secured by a short distance (see FIG. 1). For example, the length of each of the first wire 291 and the second wire 292 may be within a range of about 1/5 to 3/5 of the width W1 of the first region 210a of the first electrode unit 210 in the first axis (X) direction, thereby preventing disconnection of the first wire 291 or the second wire 292 and considerably enhancing electrical reliability. For example, the length of each of the first wire 291 and the second wire 292 may be about 0.24 mm to about 0.96 mm, but is not limited thereto.

When the length of each of the first wire 291 and the second wire 292 is less than 1/5 of the width W1 of the first region 210a of the first electrode unit 210 in the first axis (X) direction, a distance between the light emitting device 100 and the first protrusion 220a or the second protrusion 220b may be reduced, causing an issue such as a short circuit. When the length of each of the first wire 291 and the second wire 292 is more than 3/5 of the width W1 of the first region 210a of the first electrode unit 210 in the first axis (X) direction, the distance between the light emitting device 100 and the first protrusion 220a or the second protrusion 220b may increase, causing disconnection of a wire.

A width W5 of the first protrusion 220a or the second protrusion 220b of the second electrode unit 220 in the first axis (X) direction may be about 3/10 to about 4/10 of the width W10 of the first side of the substrate 201 in the first axis (X) direction. Since the insulating reflection layer 230 may include the first recess 230a and the second recess 230b, the second electrode unit 220 may include the first protrusion 220a or the second protrusion 220b. An area of the first protrusion 220a or the second protrusion 220b of the second electrode unit 220 may be equal to or less than that of the first recess 230a or the second recess 230b of the insulating reflection layer 230.

For example, the width W5 of the first protrusion 220a or the second protrusion 220b of the second electrode unit 220 in the first axis (X) direction may be 0.36 mm to 0.96 mm. When the width W5 of the first protrusion 220a or the second protrusion 220b of the second electrode unit 220 in the first axis (X) direction is less than 3/10 of the width W10 of the first side of the substrate 201 in the first axis (X) direction, the distance between the light emitting device 100 and the first protrusion 220a or the second protrusion 220b may be reduced, causing an issue such as a short circuit. When the width W5 of the first protrusion 220a or the second protrusion 220b in the first axis (X) direction is more than 4/10 of the width W10 of the first side of the substrate 201 in the first axis (X) direction, the distance between the light emitting device 100 and the first protrusion 220a or the second protrusion 220b may increase, causing disconnection of a wire.

Since the insulating reflection layer 230 may include the first recess 230a or the second recess 230b provided at a position corresponding to the first protrusion 220a or the second protrusion 220b of the second electrode unit 220, a region of each of the first and second electrode units 210 and 220 where discoloration may occur may be minimized, and a problem where light speed is reduced or electrical reliability is reduced due to a discoloration of a plating layer may be solved. Since the insulating reflection layer 230 includes the first recess 230a or the second recess 230b provided at the position corresponding to the first protrusion 220a or the second protrusion 220b of the second electrode unit 220, a problem where electrical reliability is reduced due to a disconnection of a wire that electrically connects a light emitting chip and an electrode unit may be solved.

A vertical width of the first protrusion 220a or the second protrusion 220b may be constant. The vertical width of the first protrusion 220a or the second protrusion 220b may be controlled to a constant value, and thus, a region where each of the first and second wires 291 and 292 is to be provided may be secured, and an optimal width of the insulating reflection layer 230 for enhancing a coupling force with an optical lens and increasing a light reflectance may be secured. Because a light reflection function is good but thermal dissipation efficiency is reduced depending on a material of the insulating reflection layer 230, the first protrusion 220a or the second protrusion 220b of the second electrode unit 220 close to the light emitting chip 110 may be a certain width, thereby maintaining or increasing thermal dissipation efficiency.

An area of the second region 210d of the first electrode unit 210 may be equal to or greater than that of the protection device 105 which may be subsequently provided, but is not limited thereto. The second region 210d of the first electrode unit 210 may have a polygonal shape. For example, the second region 210d of the first electrode unit 210 may have a rectangular shape or a square shape, but is not limited thereto.

A width W2 of the second region 210d of the first electrode unit 210 in the first axis (X) direction may be about 1/5 to about 2/5 of the width W1 of the first region 210a of the first electrode unit 210 in the first axis (X) direction. For example, the width W2 of the second region 210d of the first electrode unit 210 in the first axis (X) direction may be 0.24 mm to 0.48 mm.

When the width W2 of the second region 210d of the first electrode unit 210 in the first axis (X) direction is less than 1/5 of the width W1 of the first region 210a of the first electrode unit 210 in the first axis (X) direction, a region on which the protection device 105 is mounted may not be appropriately secured, causing degradation in electrical reliability. When the width W2 of the second region 210d of the first electrode unit 210 in the first axis (X) direction is more than 2/5 of the width W1 of the first region 210a in the first axis (X) direction, the region on which the protection device 105 is mounted may be very wide, causing a reduction in thermal dissipation efficiency.

The second region 210d may have a shape thatprotrudes in a direction opposite to the first axis X from the upper corner region of the first electrode unit 210. For example, the second region 210d may protrude, through a first connection part or first connector 210f, in the direction opposite to the first axis X from the upper corner region of the first electrode unit 210. A vertical width of the first connection part 210f may be less than a vertical width of the second region 210d. A width of the second region 210d may secure a region where the protection device 105 is provided. In this case, the vertical width of the first connection part 210f may be controlled less than the vertical width of the second region 210d, and thus, an optimal width of the insulating reflection layer 230 may be obtained, thereby enhancing a coupling force with an optical lens and increasing a light reflectance.

A length D4 of the first connection part 210f in the first axis (X) direction may be less than a length D3 of the fifth region 210b of the first electrode unit 210 in the first axis (X) direction. A width W4 of the first connection part 210f in the second axis (Y) direction may be less than a width W3 of the fifth region 210b of the first electrode unit 210 in the second axis (Y) direction. For example, the length D4 of the first connection part 210f in the first axis (X) direction may be within a range of 3/5 to 9/10 of the length D3 of the fifth region 210b of the first electrode unit 210 in the first axis (X) direction.

The width W4 of the first connection part 210f in the second axis (Y) direction may be within a range of 1/3 to 2/3 of the width W3 of the fifth region 210b of the first electrode unit 210 in the second axis (Y) direction. Accordingly, the length D4 and the width W4 of the first connection part 210f may be less than the length D3 and the width W3 of the fifth region 210b of the first electrode unit 210, a current may be appropriately injected into the protection device 105 and the light emitting device 100, and light reflection efficiency and a coupling force with an optical lens 260 may be enhanced.

Since the insulating reflection layer 230 may include the third recess 230c and the fourth recess 230d provided at respective positions corresponding to the third protrusion 220d of the second electrode unit 220 and the second region 210d of the first electrode unit 210, a problem where electrical reliability is reduced due to a disconnection of a wire electrically connecting a protection device and an electrode unit may be solved. Since the insulating reflection layer 230 may include the third recess 230c and the fourth recess 230d provided at the respective positions corresponding to the third protrusion 220d of the second electrode unit 220 and the second region 210d of the first electrode unit 210, a region of each of the first and second electrode units 210 and 220 where discoloration may occur may be minimized, and a problem where electrical reliability is reduced due to a disconnection of a wire that electrically connects a light emitting chip and an electrode unit may be solved.

A width W4 of the third protrusion 220e of the second electrode unit 220 in the first axis (X) direction may be about 1/10 to about 3/10 of the width W1 of the first region 210a in the first axis (X) direction. For example, the width W4 of the third protrusion 220e of the second electrode unit 220 in the first axis (X) direction may be 0.12 mm to 0.36 mm. When the width W4 of the third protrusion 220e in the first axis (X) direction is less than 1/10 of the width W1 of the first region 210a in the first axis (X) direction, a region where the third wire 293 is bonded may not be appropriately secured, causing reduction in electrical reliability. When the width W4 of the third protrusion 220e in the first axis (X) direction is more than 3/10 of the width W1 of the first region 210a in the first axis (X) direction, the region where the third wire 293 is bonded may be wide, causing reduction in thermal dissipation efficiency.

The third protrusion 220e may have a shape that protrudes in a direction from the upper corner region of the second electrode unit 220 to the first axis X. For example, the third protrusion 220e may protrude, through a second connection part or second connector 220f, in the direction from the upper corner region of the second electrode unit 220 to the first axis X. A vertical width of the second connection part 220f may be less than a vertical width of the third protrusion 220e. A width of the third protrusion 220e may secure a region where the third wire 293 of the protection device 105 is provided. In this case, the vertical width of the second connection part 220f may be less than the vertical width of the third protrusion 220e, and thus, a width of the insulating reflection layer 230 may be secured, thereby enhancing a coupling force with an optical lens and increasing a light reflectance.

A second distance D2 between the second region 210d, where the protection device 105 is provided, of the first electrode unit 210 and the third protrusion 220e of the second electrode unit 220 may be within a range of about 1/10 to about 3/10 of the width W1 of the first region 210a in the first axis (X) direction and may be secured by a short distance. For example, the second distance D2 may be about 0.12 mm to about 0.36 mm, but is not limited thereto.

Therefore, according to an embodiment, a length of the third wire 293 that electrically connects the protection device 105 and the third protrusion 220e of the second electrode unit 220 may be secured by a short distance (see FIG. 1). For example, the length of the third wire 293 may be within a range of about 2/5 to 3/5 of the width W1 of the first region 210a of the first electrode unit 210 in the first axis (X) direction, thereby preventing an issue of a disconnection of the third wire 293 and considerably enhancing electrical reliability. For example, the length of the third wire 293 may be about 0.48 mm to about 1.44 mm, but is not limited thereto.

The first electrode unit 210 may include the third region 210c, which may be located in the lower corner region of the first electrode unit 210 with respect to the second axis Y vertical to the first axis X, and the fourth region 210e, which may be located in the upper corner region of the first electrode unit 210. Also, the first electrode unit 210 may include the fifth region 210b provided between the first region 210a and each of the third and fourth regions 210c and 210e.

The width W3 of the fifth region 210b of the first electrode unit 210 in the second axis (Y) direction may be within a range of about 2/10 to about 3/10 of the width W1 of the first region 210a of the first electrode unit 210 in the first axis (X) direction. For example, the width W3 of the fifth region 210b of the first electrode unit 210 in the second axis (Y) direction may be about 0.24 mm to about 0.36 mm, but is not limited thereto. When the width W3 of the fifth region 210b in the second axis (Y) direction is less than 2/10 of the width W1 of the first region 210a in the first axis (X) direction, a width of a lead electrode may be narrowed, and resistance may increase. When the width W3 of the fifth region 210b in the second axis (Y) direction is more than 3/10 of the width W1 of the first region 210a in the first axis (X) direction, the width of the lead electrode may be considerably widened, causing the reduction in thermal dissipation efficiency.

The second electrode unit 220 may include the fourth protrusion 220c, which may be located in the lower corner region of the second electrode unit 220 with respect to the second axis Y, and the fifth protrusion 220e which is located in the upper corner region of the second electrode unit 220. The fourth protrusion 220c may correspond to the third region 210c of the first electrode unit 210, and the fifth protrusion 220e may correspond to the fourth region 210e of the first electrode unit 210. The fourth protrusion 220c and the third region 210c may be electrically separated from each other by the insulating reflection layer 230, and the fifth protrusion 220e and the fourth region 210e may be electrically separated from each other by the insulating reflection layer 230.

For example, the insulating reflection layer 230 may include the first separation region 230S1 between the fifth protrusion 220e of the second electrode unit 220 and the fourth region 210e of the first electrode unit 210 and the second separation region 230S2 between the fourth protrusion 220c of the second electrode unit 220 and the third region 210c of the first electrode unit 210 and may electrically separate the first electrode unit 210 from the second electrode unit 220.

Since the insulating reflection layer 230 may include the first separation region 230S1 and the second separation region 230S2 provided between the second electrode unit 220 and the first electrode unit 210, the insulating reflection layer 230 may electrically insulate the second electrode unit 220 from the first electrode unit 210, and an area of each of the first and second electrode units 210 and 220 may be minimized, thereby solving a problem where light speed is reduced and electrical reliability is reduced due to a discoloration of a plating layer.

Referring to FIG. 1 and FIG. 2, the semiconductor device package 200 may include the substrate 201, the first electrode unit 210 provided on the substrate 201, the second electrode unit 220 separated from the first electrode unit 210 and provided on the substrate 201, and the insulating reflection layer 230 provided between the first electrode unit 210 and the second electrode unit 220. The first electrode unit 210 may include a first electrode extension part or first electrode extension, which may be provided outside the first electrode unit 210 with respect to the first axis X and may extend in the second axis (Y) direction vertical to the first axis X, the first region 210a, which may be separated from the first electrode extension part in a third axis (−X) direction opposite to the first axis X and where the light emitting device 100 may be provided, the second region 210d, which may be separated from the first electrode extension part in the first axis X direction and may be separated from the first region 210a in the second axis (Y) direction vertical to the first axis X direction and where the protection device 105 may be provided, the first connection part 210b, which may be provided between the first region 210a and the first electrode extension part and may electrically connect the first region 210a to the first electrode extension part, and the second connection part 210f, which may be provided between the second region 210d and the first electrode extension part and may electrically connect the second region 210d to the first electrode extension part.

The first electrode extension part of the first electrode unit 210 may include a first vertical part 210g1, which may be provided in parallel with the second axis (Y) direction between the first connection part 210b and the second connection part 210f, a first diagonal part 210g2, which may be provided between the first vertical part 210g1 and the second connection part 210f and may have a width which corresponds to the first axis (X) direction and increases progressively closer to the second axis (Y) direction, a first protrusion 210e, which may be separated from the second region 210d in the second axis (Y) direction, provided outside the first electrode unit 210 with respect to the second axis Y, connected to the first diagonal part 210g2, and provided to protrude in the first axis (X) direction, a second protrusion 210h, which may be provided outside the first region 210a in a fourth axis (−Y) direction opposite to the second axis (Y) direction, and a second diagonal part 210c, which may be provided between the second protrusion 210h and the first vertical part 210g1 of the first electrode extension part and may have a width which corresponds to the first axis (X) direction and increases progressively closer to the fourth axis (−Y) direction.

The second diagonal part 210c may be provided to be connected to the second protrusion 210h. Start points of the first diagonal part 210g2 and the second diagonal part 210c may be positions corresponding to an upper end and a lower end of the first region 210a of the first electrode unit 210, but are not limited thereto.

The first diagonal part 210g2 and the second diagonal part 210c may be provided to extend from an upper end and a lower end of the first vertical part 210g1, respectively. The first diagonal part 210g2 may have a width that increases in the second axis (Y) direction from an upper end of the first vertical part 210g1, and the second diagonal part 210c may have a width that increases in the fourth axis (−Y) direction from a lower end of the first vertical part 210g1. Accordingly, a width of the insulating reflection layer 230 may be secured, and an area of the first electrode part 210 may be secured for a thermal dissipation effect, thereby enhancing an adhesive force with an optical lens and securing thermal stability to enhance reliability.

A constant thickness of each of the first protrusion 210g2 and the second protrusion 210h of the first electrode unit 210 in the fourth axis (−Y) direction may be maintained, and thus, an area of the first electrode unit 210 may be secured for thermal dissipation efficiency, and the insulating reflection layer 230 may be appropriately provided to ensure reliability.

The second electrode unit 220 may include a second electrode extension part or second electrode extension provided outside the second electrode unit 210 in the third axis (−X) direction to extend in the second axis (Y) direction, a first bonding part 220a provided in the first axis (X) direction to have a region overlapping the first region 210a and connected to the second electrode extension part, a second bonding part 220b provided in the first axis (X) direction to have a region overlapping the first region 210a, separated from the first bonding part 220a in the second axis (Y) direction, and connected to the second electrode extension part, a third bonding part 220d provided in the first axis (X) direction to have a region overlapping the second region 210d and connected to the second electrode extension part, a third protrusion 220e provided to extend in the first axis (X) direction, separated from the third bonding part 220d in the second axis (Y) direction, and connected to the second electrode extension part, and a fourth protrusion 220c provided to extend in the first axis (X) direction, separated from the second bonding part 220b in the fourth axis (−Y) direction, and connected to the second electrode extension part.

The second electrode extension part of the second electrode unit 220 may include a second vertical part 220g1 provided in parallel with the second axis (Y) direction between the first bonding part 220a and the second bonding part 220b, a third diagonal part 220g2 provided between the third protrusion 220e and the second vertical part 220g1 and having a width that corresponds to the first axis (X) direction and increases progressively closer to the second axis (Y) direction, and a fourth diagonal part 220g3 provided between the fourth protrusion 220c and the second vertical part 220g1 and having a width that corresponds to the first axis (X) direction and increases progressively closer to the fourth axis (−Y) direction.

Since a thickness of the second connection part 220f may be thinly set in the third bonding part 220d, a region of the second electrode unit 220 where discoloration may occur may be minimized, thereby solving a problem where light speed is reduced and electrical reliability is reduced due to a discoloration of a plating layer.

FIG. 3 is a cross-sectional view of the substrate 201 and the light emitting device 100 in the semiconductor device package 200 according to the embodiment. The light emitting device 100 may include a light emitting chip 110 and a phosphor layer 120 provided on the first electrode unit 210.

The substrate 201 may include the first electrode unit 210 and the second electrode unit 220 provided on an upper surface there and may include a first bottom electrode 281 and a second bottom electrode 282 provided a lower surface thereof. The substrate 201 may include a first connection electrode 219, which may electrically connect the first electrode unit 210 and the first bottom electrode 281, and a second connection electrode 229, which may electrically connect the second electrode unit 220 and the second bottom electrode 282. The first electrode unit 210 and the second electrode unit 220 may be provided not to vertically overlap the insulating reflection layer 230, thereby solving a problem where light speed is reduced and electrical reliability is reduced due to a discoloration of a plating layer of a substrate.

The first bottom electrode 281, the first connection electrode 219, the second bottom electrode 282, and the second connection electrode 229 may each be formed of a material which is the same as that of the first electrode unit 210 or the second electrode unit 220, but are not limited thereto. For example, the first bottom electrode 281, the first connection electrode 219, the second bottom electrode 282, and the second connection electrode 229 may each be formed of a single layer or a multilayer including one or more of titanium (Ti), copper (Cu), nickel (Ni), gold (Au), chromium (Cr), tantalum (Ta), platinum (Pt), tin (Sn), silver (Ag), and phosphorus (P).

The substrate 201 may include a heat dissipation part 283 between the first bottom electrode 281 and the second bottom electrode 282 and may be electrically disconnected from the first bottom electrode 281 or the second bottom electrode 282. The heat dissipation part 283 may have a horizontal width which may be greater than a horizontal width of the first bottom electrode 281 or the second bottom electrode 282 and may have an area which may be greater than that of the first bottom electrode 281 or the second bottom electrode 282, thereby enhancing thermal dissipation efficiency. The heat dissipation part 283 may have a thickness which may be the same as that of the first bottom electrode 281 or the second bottom electrode 282, but is not limited thereto.

The heat dissipation part 283 may be provided to overlap the light emitting device 100 in a vertical direction, thereby efficiently dissipating heat occurring in the light emitting device 100. The heat dissipation part 283, the first bottom electrode 218, and the second bottom electrode 282 may be adhered to a circuit board by an adhesive member, such as, e.g., a solder.

Referring to FIG. 3, the light emitting device 100 may include the light emitting chip 110 and the phosphor layer 120. The phosphor layer 120 may absorb some of light emitted from the light emitting chip 110 and may convert the light into light having another wavelength. The phosphor layer 120 may be formed by adding a phosphor to a light-transmitting resin material, such as, e.g., silicon or epoxy, and the phosphor may include at least one of a yellow phosphor, a green phosphor, a blue phosphor, and a red phosphor. For example, the phosphor layer 120 may be one or more selected from nitride/oxynitride phosphor mainly activated by lanthanoid element, such as Eu or Ce, alkaline earth halogen apatite phosphor mainly activated by lanthanoid element such as Eu or transition metal element such as Mn, alkaline earth metal boric acid halogen phosphor, alkaline earth metal aluminate phosphor, rare earth aluminate mainly activated by alkaline earth silicate, alkaline earth emulsion, alkaline earth thio-gallate, alkaline earth silicon nitride, germanide or lanthanoid element such as Ce, and organic and organic complex mainly activated by rare earth silicate or lanthanoid element such as Eu.

The light emitting device 100 may combine light emitted from the phosphor layer 120 and light emitted from the light emitting chip 110 to emit white light. The white light may have at least one color temperature of warm white, a cool white, and neutral white. The phosphor layer 120 may be provided as a film type, and thus, an upper surface and a lower surface of the phosphor layer 120 may be provided as a plane. However, the present embodiment is not limited thereto.

FIG. 4 is a cross-sectional view of the light emitting chip 110 in the semiconductor device package 200 according to the embodiment. Referring to FIG. 4, the light emitting chip 110 may include at least one of a light emitting structure 10 including a plurality of semiconductor layers 11 to 13, a first electrode layer 20 under the light emitting structure 10, a second electrode layer 50 under the first electrode layer 20, an insulation layer 41 between the first and second electrode layers 20 and 50, and a pad 25.

The light emitting structure 10 may include a first semiconductor layer 11, an active layer 12, and a second semiconductor layer 13. For example, the first semiconductor layer 11 may include a first conductive type dopant, for example, an n-type semiconductor layer with an n-type dopant added thereto, and the second semiconductor layer 13 may include a second conductive type dopant, for example, a p-type semiconductor layer with a p-type dopant added thereto. An upper surface of the first semiconductor layer 11 may be provided as a concave-convex surface 11A, which may be rough, and the concave-convex surface 11A may improve light extraction efficiency. A side cross-sectional surface of the concave-convex surface 11A may have a polygonal shape or a hemispherical shape.

The first electrode layer 20 may be provided between the light emitting structure 10 and the second electrode layer 50 and may include a first contact layer 15, a reflection layer 17, and a capping layer 19. The first contact layer 15 may be formed of conductive oxide, conductive nitride, or metal. The reflection layer 17 may be formed of metal or an alloy including at least one of Ag, Ni, Al, Rh, Pd, Ir, Ru, Mg, Zn, Pt, Cu, Au, and Hf. The capping layer 19 may be formed of metal, and for example, may include at least one of Au, Cu, Ni, Ti, Ti-W, Cr, W, Pt, V, Fe, and Mo. A contact part 34 of the capping layer 19 may be provided in a region which may not overlap the light emitting structure in a vertical direction, and may vertically overlap the pad 25.

The pad 25 may be formed of a single layer or a multilayer. When the pad 25 is formed of a single layer, the pad 25 may include Au, and when the pad 25 is formed of a multilayer, the pad 25 may include at least two of Ti, Ag, Cu, and Au. When the pad 25 is formed of multilayers, the pad 25 may have a stacked structure of Ti/Ag/Cu/Au or a stacked structure of Ti/Cu/Au.

A protection layer 30 and a light transmitting layer 45 may contact a circumference of the pad 25. The light transmitting layer 45 may protect a surface of the light emitting structure 10, insulate the pad 25 from the light emitting structure 10, and contact a peripheral portion of the protection layer 30. The light transmitting layer 45 may be formed of, for example, oxide or nitride. The protection layer 30 may be formed of oxide or nitride.

The light emitting chip 110 may include an insulation layer 41 provided between the first electrode layer 20 and the second electrode layer 50. The insulation layer 41 may be formed of at least one selected from a group consisting of $SiO_2$, $Si_xO_y$, $Si_3N_4$, $Si_xN_y$, $SiO_xN_y$, $Al_2O_3$, $TiO_2$, and AlN.

The second electrode layer 50 may include an anti-diffusion layer 52 provided under the insulation layer 41, a bonding layer 54 provided under the anti-diffusion layer 52, and a conductive supporting member 56 provided under the bonding layer 54. The second electrode layer 50 may be electrically connected to the first semiconductor layer 11. The anti-diffusion layer 52 may include at least one of Cu, Ni, Ti, Ti-W, Cr, W, Pt, V, Fe, and Mo. The bonding layer 54 may include a barrier metal or a bonding metal. The conductive supporting member 56 may include a metal or carrier substrate.

A second contact layer 33 may be provided inside the first semiconductor layer 11 and may contact the first semiconductor layer 11. An upper surface of the second contact layer 33 may be provided higher in position than a lower surface of the first semiconductor layer 11, electrically connected to the first semiconductor layer 11, and insulated from the active layer 12 and the second semiconductor layer 13.

The second contact layer 33 may be connected to a protrusion 51 of the second electrode layer 50, and the protrusion 51 may protrude from the anti-diffusion layer 52. The protrusion 51 may pass through a hole 41A provided in the insulation layer 41 and the protection layer 30 and may be insulated from the first electrode layer 20. The second contact layer 33 may include, for example, at least one of Cr, V, W, Ti, Zn, Ni, Cu, Al, Au, and Mo. As another example, the protrusion 51 may include at least one of materials included in the anti-diffusion layer 52 and the bonding layer 54, but is not limited thereto. The protrusion 51 may include, for example, at least one of Ti, Au, Sn, Ni, Cr, Ga, In, Bi, Cu, Ag, Nb, Pd, and Ta.

Figure 5:
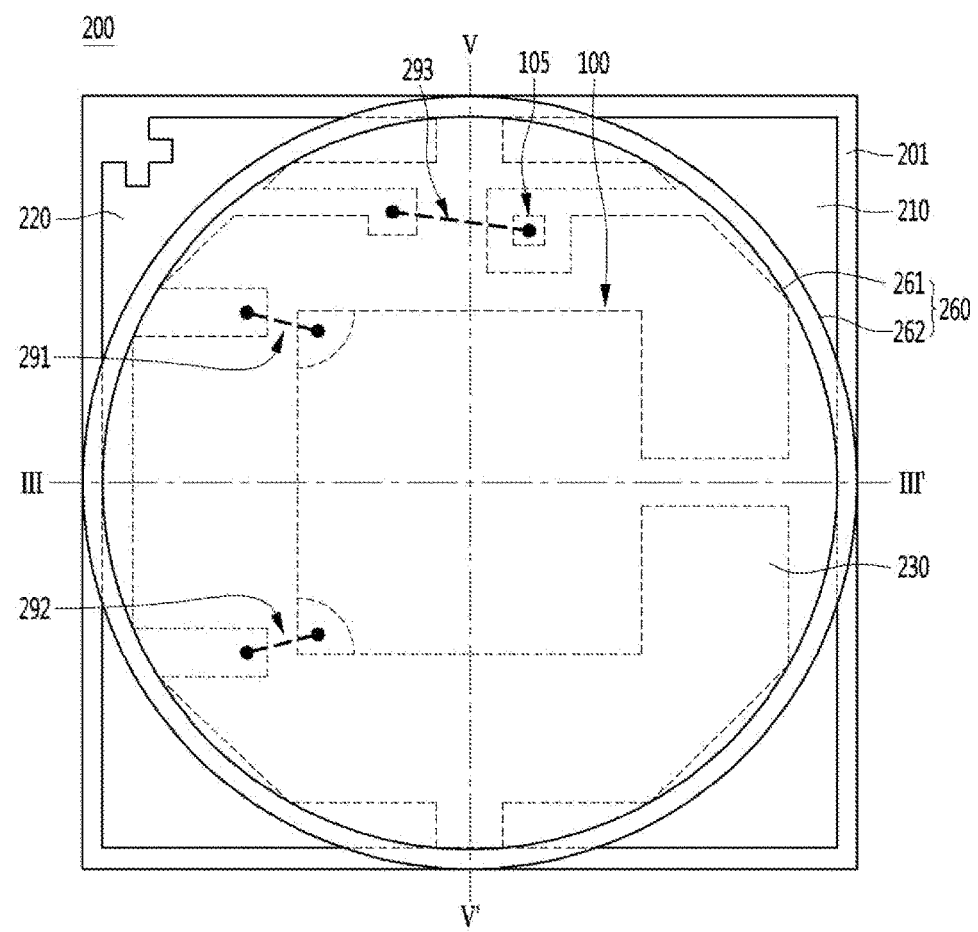
FIG. 5 is a transparent plan view of a semiconductor device package according to the embodiment.
Figure 6A:
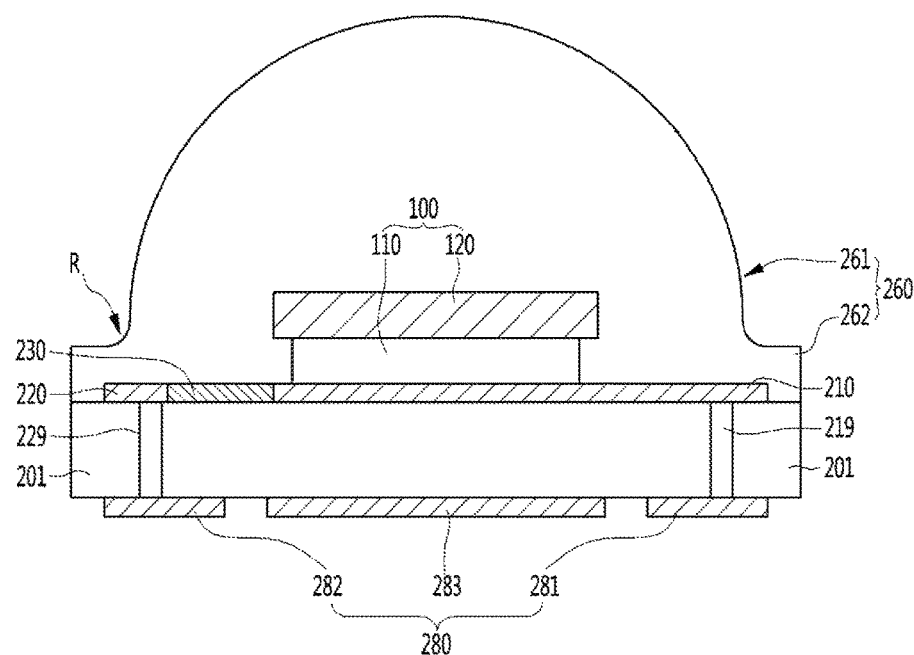
FIG. 6A is a cross-sectional view taken along line III-III' of a semiconductor device package according to the embodiment.
Figure 6B:
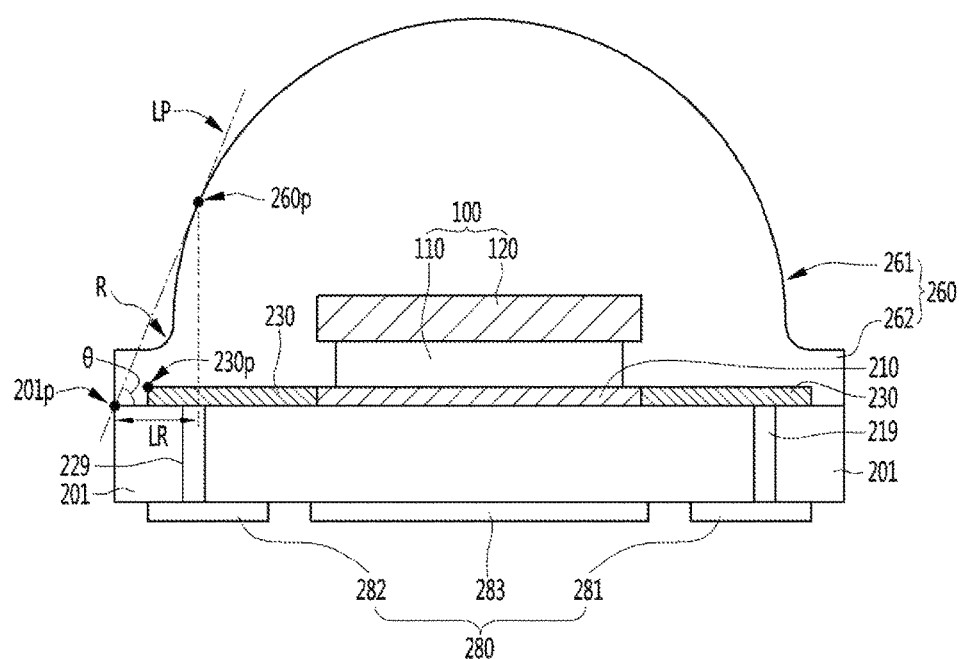
FIG. 6B is a cross-sectional view taken along line V-V' of a semiconductor device package according to the embodiment.

Referring to FIG. 5, FIG. 6A, and FIG. 6B, a semiconductor device package 200 may include an optical lens 260 on a substrate 201 on which a light emitting device 100 may be provided. The optical lens 260 may be provided on the light emitting device 100 and the insulating layer reflection layer 230. The optical lens 260 may be formed of transparent resin, such as, e.g., silicon or epoxy. Alternatively, the optical lens 260 may be formed of a glass material or a transparent plastic material.

The optical lens 260 may include a lens part or lens 261 having a curvature and a buffer part or buffer 262 extending from the lens part 261 to a side surface. The lens part 261 may circumscribe the insulating reflection layer 230. Accordingly, a coupling force of the lens part 261 and the insulating reflection layer 230 may be good, and a coupling force of the optical lens 260 and the substrate 201 may be enhanced, thereby providing a semiconductor device package which may prevent penetration of water or which may have excellent mechanical coupling force.

The optical lens 260 may include a curvature part R between the lens part 261 and the buffer part 262. However, as in FIG. 6C, the optical lens 260 may not include the buffer part, and in this case, may not include the curvature part R. In the semiconductor device package 200, the optical lens 260 and the insulating reflection layer 230 may each be formed of a resin-based material, and thus, a coupling force of two elements may be very good, thereby providing a semiconductor device package which may prevent penetration of water or which may have excellent mechanical coupling force.

The insulating reflection layer 230 may include a plurality of polygonal shapes or a plurality of recess structures, thereby enhancing a coupling force between the optical lens 260 and the insulating reflection layer 230. In order to enhance a light extraction efficiency of the semiconductor device package 200, the insulating reflection layer 230 may use phenyl-based silicon which has a refractive index of 1.45 to 1.7 at a wavelength of 450 nm, thereby enhancing a reflection function. In a case where the reflection function of the insulating reflection layer 230 is enhanced, thermal stability may be reduced in terms of a material characteristic. In this case, the substrate 201 may use nitride-based aluminum (for example, AlN) which is high in thermal stability, thereby improving both the thermal stability and light extraction efficiency of the semiconductor device package 200. In the semiconductor device package 200, in consideration of a thermal expansion coefficient of each of the first and second electrode units 210 and 220, the insulating reflection layer 230, and the substrate 201, thermal stability may be improved, and light extraction efficiency may be considerably enhanced.

The lens part 261 may be provided on the insulating reflection layer 230, and the insulating reflection layer 230 may not protrude outward from a lower surface of the lens part 261. For example, the insulating reflection layer 230 may include one or more polygonal shapes, and the lower surface of the lens part 261 may contact vertexes of four or more polygon-shaped outer corners of the insulating reflection layer 230. Also, the insulating reflection layer 230 may inscribe the lower surface of the lens part 261. The lens part 261 of the optical lens 260 may pass by an outer corner of each of the first and second separation regions 230S1 and 230S2, as shown in FIG. 2.

The lens part 261 of the optical lens may circumscribe the insulating reflection layer 230 having a polygonal shape, and thus, an area where the lens part 261 contacts the insulating reflection layer 230 may be optimized, thereby providing a semiconductor device package and a lighting device including the same, which may enhance a coupling force between the lens part and the insulating reflection layer and may solve a problem where light speed is reduced due to discoloration of a plating layer of a substrate and a problem where electrical reliability is reduced due to a discoloration of a plating layer of a substrate.

Referring to FIG. 6B, one or more polygonal vertexes 230p may vertically overlap a virtual straight line LP, circumscribing a curved surface of the lens part 261 of the optical lens 260, in a region LR where the virtual straight line LP contacts the substrate 201. For example, an angle "θ" between an upper surface of the substrate 201 and the straight line LP connecting an outer corner 201p of the substrate 201 and a contact point 260p of the lens part 260 may be about 60 degrees to about 90 degrees. When the angle "θ" is 60 degrees or more, it may be easy to control a directional angle of light emitted from the semiconductor device package 200. When the angle "θ" is 90 degrees or less, an area where the lens part 261 contacts the insulating reflection layer 230 may be widened, thereby enhancing light extraction efficiency. As in FIG. 6C, if the optical lens 260 does not include the buffer part, the angle "θ" may be 90 degrees.

Referring to FIG. 2, an upper surface of the insulating reflection layer 230 may be provided in a polygonal shape including a plurality of vertexes. Therefore, vertexes of the insulating reflection layer 230 may include one or more first points where a distance to a center of the substrate 201 may be within a first range.

When the center of the substrate 201 has a tetragonal shape, for example, a square shape, a center may be a point contacting a diagonal line. The center of the substrate 201 may vertically overlap a center of the light emitting device 100, but is not limited thereto. Also, the center of the substrate 201 may vertically overlap a center of the first region 210a of the first electrode unit 210, but is not limited thereto. For example, the vertexes of the insulating reflection layer 230 may include the one or more first points where the distance to the center of the substrate 201 may be within the first range.

Referring to FIG. 6B, the optical lens 260 may include a lens part 261 and a curvature part R. Curvature directions of the curvature part R and the lens part may differ. The first point may vertically overlap the curvature part R.

The vertexes of the insulating reflection layer 230 may include the first point and a second point where a distance to the center of the insulating reflection layer 230 may be less than the first range. For example, referring to FIG. 5, the vertexes of the insulating reflection layer 230 may include a first point contacting an outer circumference of the lens part 261 of the optical lens. Also, the vertexes of the insulating reflection layer 230 may include a second point provided in an inner side of the outer circumference of the lens part 261 of the optical lens, and a distance from the second point to the center of the insulating reflection layer 230 may be less than the first range.

A angle "θ" between the upper surface of the substrate 201 and a contact line LP circumscribing the optical lens 260 may be about 60 degrees to about 90 degrees. For example, the contact line LP circumscribing the optical lens 260 may pass by an upper surface of an outer corner of the substrate 201, an angle "θ" between the contact line LP and a point 201p contacting the upper surface of the outer corner of the substrate 201 may be about 60 degrees to about 90 degrees. The first point may vertically overlap a line that connects an external contact point 260p between the contact line LP and the optical lens to the point 201p at which the contact line LP contacts the substrate.

Referring to FIG. 6A and FIG. 6B, the buffer part 262 of the optical lens 260 may be provided on a circumference of the light emitting device 100 and may have a flat upper surface. The buffer part 262 of the optical lens 260 may extend from the circumference of the light emitting device 100 to an outer side of each of the first and second electrode units 210 and 220. The buffer part 262 may contact the upper surface of the substrate 201 in a region where the first and second electrode units 210 and 220 of the substrate 201 are not provided. An outer surface of the buffer part 262 may be provided as a vertical surface which may be the same as a side surface of the substrate 201, but is not limited thereto. The buffer part 262 may be provided along an outer edge of the substrate 201, thereby preventing penetration of water.

A curved part R between the lens part 261 and the buffer part 262 of the optical lens 260 may have a curvature radius which may be within a range of about 0.2±0.02 mm. A center of a radius of the curved part R between the lens part 261 and the buffer part 262 may be provided on the buffer part 262. An upper surface of the buffer part 262 may be provided lower in position than an extension line of an upper surface of the light emitting chip 110.

Figure 7A:
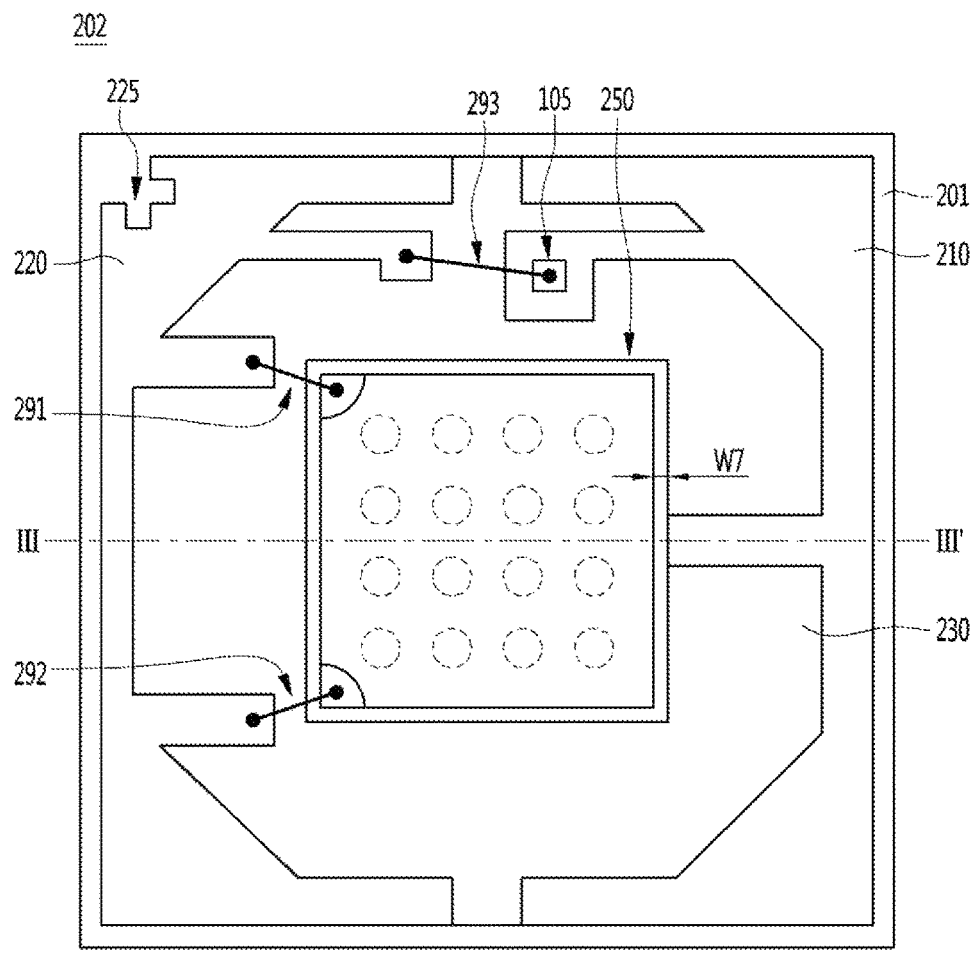
FIG. 7A is a plan view of a substrate and a light emitting device in a semiconductor device package according to another embodiment.
Figure 7B:
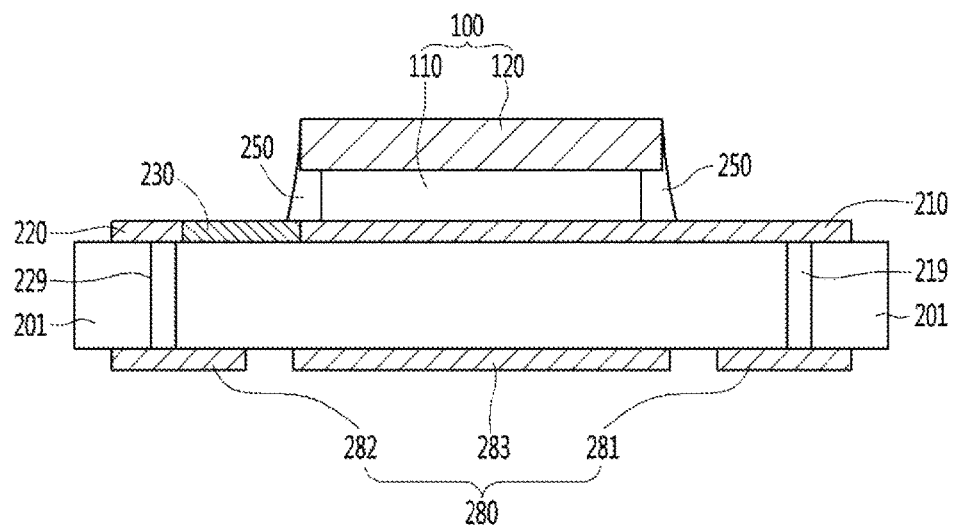
FIG. 7B is a cross-sectional view of a substrate and a light emitting device in a semiconductor device package according to the other embodiment.

FIG. 7A is a plan view of a substrate and a light emitting device in a semiconductor device package 202 according to another embodiment, and FIG. 7B is a cross-sectional view of a substrate and a light emitting device in the semiconductor device package 202 according to the other embodiment. Technical features of the previous embodiments may be applied to the other embodiment. Hereinafter, technical features of the other embodiment are described.

The semiconductor device package 202 may include a first electrode unit 210 provided on a substrate 201, a light emitting device 100 provided on the first electrode unit 210, a second electrode unit 220 electrically disconnected from the first electrode unit 210 and provided on the substrate 201, an insulating reflection layer 230 provided on a circumference of the light emitting device 100 between the first electrode unit 210 and the second electrode unit 220 and having a polygonal shape, and a resin reflection layer 250 provided on a side circumference of the light emitting device 100.

The semiconductor device package 202 may include the resin reflection layer 250 provided on the side circumference of the light emitting device 100, thereby improving light speed. The resin reflection layer 250 may be provided on the circumference of the light emitting device 100. The resin reflection layer 250 may be formed by adding metal oxide to resin, thereby increasing reflectance. The resin may include silicon or epoxy, and the metal oxide may be a material having a refractive index higher than that of the resin and may include, for example, at least one of $Al_2O_3$, $TiO_2$, and $SiO_2$. The metal oxide may be provided by 5 wt % or more (for example, a range of 5 wt % to 30 wt %) in the resin reflection layer 250. The resin reflection layer 250 may have a reflectance of 90% or more of light emitted from the light emitted from the light emitting device 100. When the metal oxide is provided by less than 5 wt % of the resin reflection layer 250, reflectance may be reduced, and when more than 30 wt %, conductivity may increase, causing a short circuit.

The resin reflection layer 250 may be provided on a circumference of the phosphor layer 120. The resin reflection layer 250 may contact a side surface of the light emitting chip 110 and a side surface of the phosphor layer 120. A portion of the resin reflection layer 250 may be provided along the side surface of the light emitting chip 110 and may be provided more inward than an outer surface of the phosphor layer 120. The resin reflection layer 250 may have a thickness which may be thinned progressively closer to an upper surface of the phosphor layer 120.

For example, the resin reflection layer 250 may be dispensed on a circumference of the light emitting chip 110, and thus, may extend to the side surface of the phosphor layer 120 by a capillary phenomenon. A void may not be formed in a region between the resin reflection layer 250, the light emitting chip 110, and the phosphor layer 120, thereby reinforcing an adhesive force to the region between the resin reflection layer 250, the light emitting chip 110, and the phosphor layer 120. An upper end of the resin reflection layer 250 may have a height which may be equal to or lower in position than the upper surface of the phosphor layer 120. The resin reflection layer 250 provided on the side surface of the phosphor layer 120 may reflect light, emitted to the side surface of the phosphor layer 120, to an upper side to enhance a light speed.

A surface of the resin reflection layer 250 may be provided as a curved surface, and the curved surface may reflect light, which is incident on the surface, to the outside. Moreover, the resin reflection layer 250 may be provided on the insulating reflection layer 230. Therefore, a coupling force between a material of the resin reflection layer 250 and a material of the insulating reflection layer 230 may be good, thereby enhancing a coupling force between the substrate 201 and the light emitting chip 110.

IA width W7 of the resin reflection layer 250 in a first axis (X) direction may be within a range of about 1/20 to about 3/20 of a width W1 of a first region 210a of the first electrode unit 210 in the first axis (X) direction. For example, the width W7 of the resin reflection layer 250 in the first axis (X) direction may be about 0.06 mm to about 0.81 mm, but is not limited thereto. When the width W7 of the resin reflection layer 250 in the first axis (X) direction is less than 1/20 of the width W1 of the first region 210a of the first electrode unit 210 in the first axis (X) direction, a side thickness of the resin reflection layer 250 may be thinned, and a function of a reflection layer may be degraded. When more than 3/20, the side thickness of the resin reflection layer 250 may be unnecessarily thickened.

Figure 8:
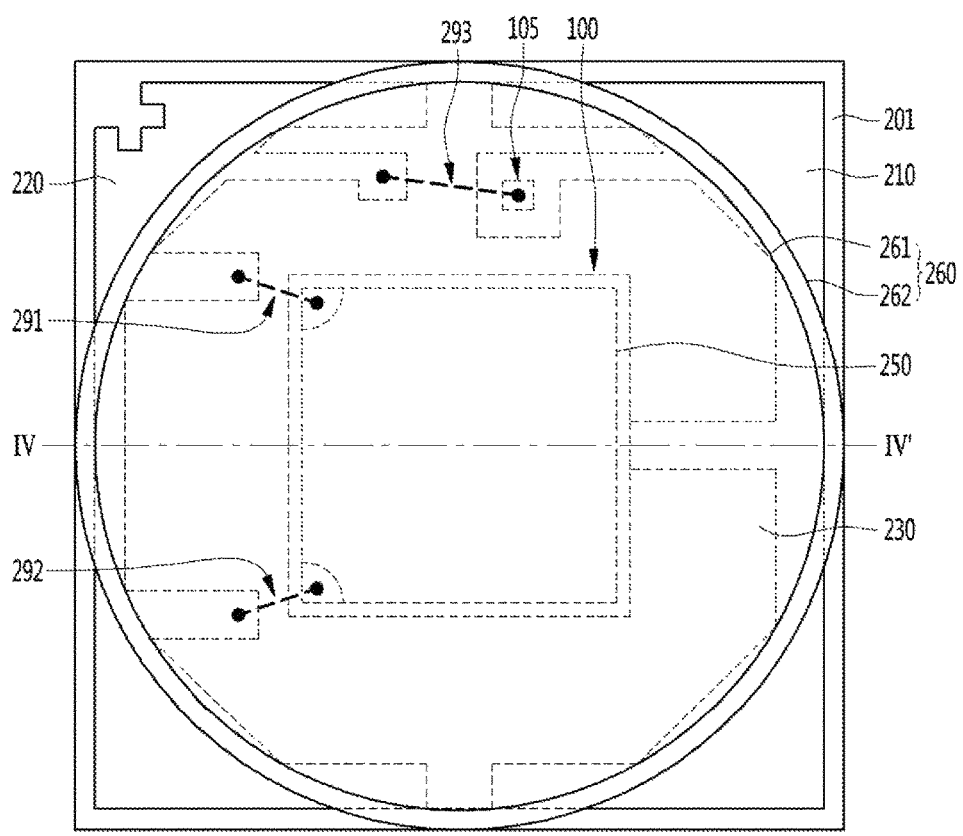
FIG. 8 is a transparent plan view of a semiconductor device package according to the other embodiment.
Figure 9:
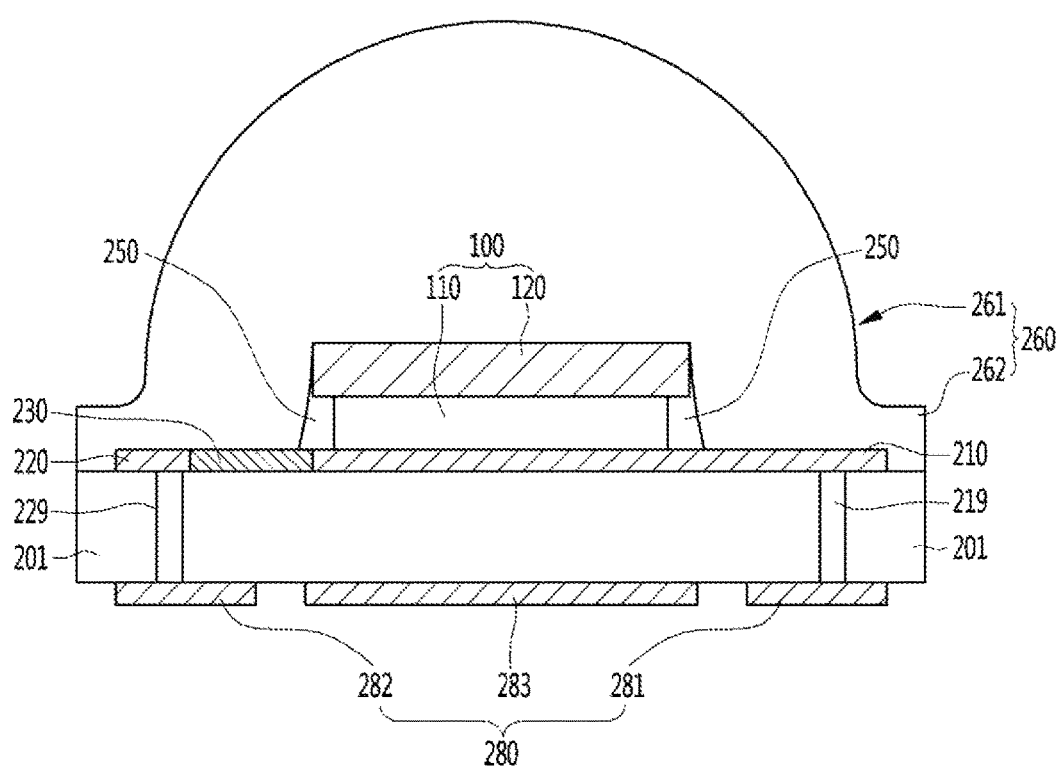
FIG. 9 is a cross-sectional view of a semiconductor device package according to the other embodiment.

Referring to FIG. 8 and FIG. 9, in the semiconductor device package 202, an optical lens 260 may be provided on the light emitting device 100, the resin reflection layer 250, and the insulating reflection layer 230. The optical lens 260 may be formed of transparent resin, such as, e.g., silicon or epoxy, and the optical lens 260 including the transparent resin may be provided on the resin reflection layer 250 and the insulating reflection layer 230. A coupling force between the optical lens 260, the resin reflection layer 250, and the insulating reflection layer 230 may be good, and a coupling force of the optical lens 260 and the substrate 201 may be enhanced, thereby providing a semiconductor device package which may prevent penetration of water or which may have excellent mechanical coupling force.

A portion of the resin reflection layer 250 may be provided along a side surface of the light emitting device 100 and may be provided more inward than an outer surface of the phosphor layer 120. For example, the resin reflection layer 250 may be dispensed on a circumference of the light emitting device 100, and thus, may extend to the side surface of the phosphor layer 120 by a capillary phenomenon. A void may not be formed in a region between the resin reflection layer 250, the light emitting device 100, and the phosphor layer 120, thereby reinforcing an adhesive force to the region between the resin reflection layer 250, the light emitting device 100, and the phosphor layer 120.

The resin reflection layer 250 may have a structure that surrounds a side surface of a light emitting chip 110, and a lens part 261 of the optical lens 260 may contact the side surface of the resin reflection layer 250, thereby obtaining an adhesive force which may be far greater than an adhesive force to the light emitting device. Thermal expansion coefficients of the lens part 261 and the resin reflection layer 250 contacting each other may be similar, thereby providing a semiconductor device package which may have very good mechanical and thermal reliability.

A plurality of semiconductor device packages may be arrayed on a substrate, and a light guide plate, a prism sheet, a diffusive sheet, and a fluorescent sheet, which are optical members, may be provided on a path of light emitted from each of the semiconductor device packages. The semiconductor device packages according to embodiments may be applied to, for example, backlight units, lighting units, display devices, indication devices, lamps, street lamps, lighting devices for vehicles, display devices for vehicles, smartwatches, but is not limited thereto.

Figure 10:
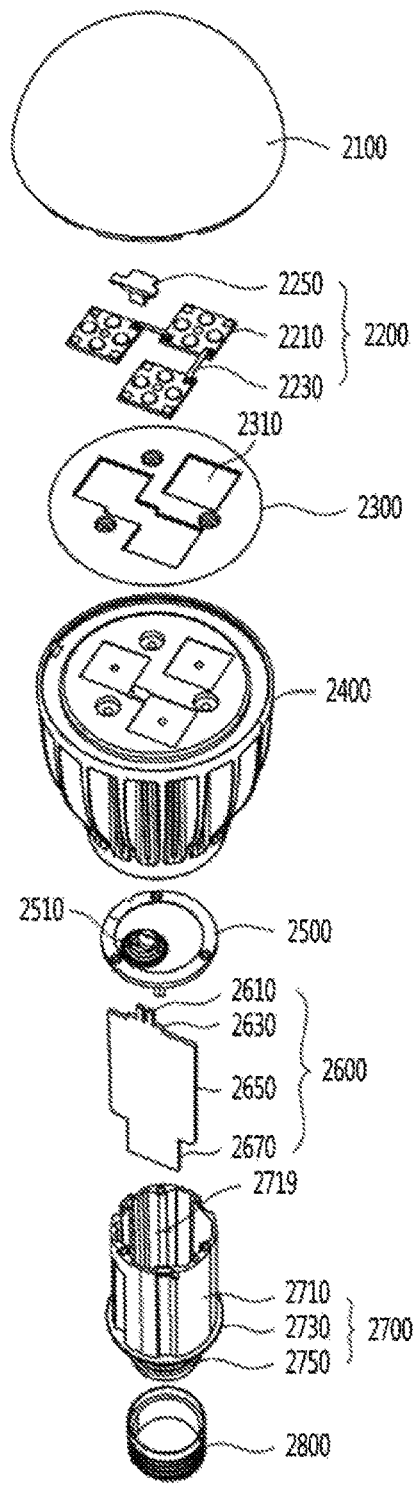
FIG. 10 is a perspective view of a lighting device according to another embodiment.

Referring to FIG. 10, a lighting device including the semiconductor device package may include a cover 2100, a light source module 2200, a heat dissipation unit 2400, a power supply unit 2600, an internal case 2700, and a socket 2800. The lighting device may further include one or more of a member 2300 and a holder 2500. The light source module 2200 may include a light emitting device or a semiconductor device package according to embodiments.

The light source module 2200 may include a light source unit 2210, a connection plate 2230, and a connector 2250. The member 2300 may be provided on an upper surface of the heat dissipation unit 2400 and may include a plurality of guide grooves 2310 into which a plurality of the light source units 2210 and the connector 2250 may be inserted.

The holder 2500 may cover an accommodation groove 2719 of an insulation part 2710 of the internal case 2700. Therefore, the power supply unit 2600 accommodated into the insulation part 2710 of the internal case 2700 may be sealed. The holder 2500 may have a guide protrusion 2510.

The power supply unit 2600 may include a protrusion 2610, a guide part 2630, a base 2650, and an extension part 2670. The internal case 2700 may include a molding part provided therein along with the power supply unit 2600. The molding part may be a part formed by hardening a molding liquid, and may enable the power supply unit 2600 to be fixed to the inside of the internal case 2700.

Embodiments disclosed herein may provide a semiconductor device package and a lighting device including the semiconductor device package, which may solve a problem where light speed is reduced due to discoloration of a plating layer of a substrate and where electrical reliability is reduced due to a discoloration of a plating layer of a substrate. Embodiments disclosed herein may also provide a semiconductor device package and a lighting device including the semiconductor device package, which may solve a problem where electrical reliability is reduced due to disconnection of a wire that electrically connects a light emitting chip and an electrode unit, and where reliability is reduced due to a reduction in a coupling force between an optical lens and a substrate. Embodiments disclosed herein further provide a semiconductor device package and a lighting device including the semiconductor device package, in which thermal and electrical reliability may be enhanced by using a substrate which has good thermal dissipation.

According to embodiments disclosed herein, a semiconductor device package may include a substrate 201; a first electrode unit 210 provided on the substrate 201; a second electrode unit 220 electrically disconnected from the first electrode unit 210 and provided on the substrate 201; a light emitting device 100 provided on the first electrode unit 210; an insulating reflection layer 230 provided between the first electrode unit 210 and the second electrode unit 220; and an optical lens 260 provided on the insulating reflection layer 230.

An upper surface of the insulating reflection layer 230 may be provided in a polygonal shape including a plurality of vertexes. When a center of the substrate 201 has a tetragonal shape, for example, a square shape, the center may be a point contacting a diagonal line. The center of the substrate 201 may vertically overlap a center of the light emitting device 100, but is not limited thereto. Also, the center of the substrate 201 may vertically overlap a center of the first region 210a of the first electrode unit 210, but is not limited thereto.

An angle "θ" between the upper surface of the substrate 201 and a contact line LP circumscribing the optical lens 260 may be about 60 degrees to about 90 degrees. For example, the contact line LP circumscribing the optical lens 260 may pass by an upper surface of an outer corner of the substrate 201, an angle "θ" between the contact line LP and a point 201p contacting the upper surface of the outer corner of the substrate 201 may be about 60 degrees to about 90 degrees. The first point may vertically overlap a line which connects an external contact point 260p between the contact line LP and the optical lens to the point 201p at which the contact line LP contacts the substrate.

The optical lens 260 may include a lens part 261 and a curvature part R. Curvature directions of the curvature part and the lens part may differ. The first point may vertically overlap the curvature part R. Vertexes of the insulating reflection layer 230 may include the first point and a second point where a distance to the center of the insulating reflection layer 230 may be less than the first range.

A semiconductor device package according to embodiments disclosed herein may include a substrate 201; a first electrode unit 210 provided on the substrate 201; a second electrode unit 220 electrically disconnected from the first electrode unit 210 and provided on the substrate 201; a light emitting device 100 provided in a first region 201a of the first electrode unit 210; an insulating reflection layer 230 provided on a circumference of the light emitting device 100 between the first electrode unit 210 and the second electrode unit 220 to have a plurality of polygonal shapes; and an optical lens 260 provided on the insulating reflection layer 230 and the light emitting device 100.

The optical lens 260 may include a lens part 261, which may be provided on the insulating reflection layer 230 and the light emitting device 100 to have a certain curvature, and a buffer part or buffer 262, which may be provided outside the lens part 261 and may include a flat upper surface.

However, the optical lens 260 is not limited thereto, and the optical lens 260 may not include the buffer part 262.

The optical lens 260 may include a curved part R provided between the lens part 261 and the buffer part 262. When the optical lens 260 includes the curved part R, the curved part R and the lens part 261 may have different curvature directions. When the optical lens 260 does not include the curved part R, the optical lens 260 may not include the curved part.

The curved part R may vertically overlap one or more external vertexes of a plurality of vertexes having a polygonal shape. In a case where the vertex vertically overlaps the curved part R, since an area of a region where an electrode unit corresponding to a shape of the insulating reflection layer 230 having a polygonal shape contacts the optical lens 260 increases, the thermal stability and reliability of the semiconductor device package may be enhanced, and since an area of a region where the insulating reflection layer 230 contacts the optical lens 260 increases, a directional angle or an extraction efficiency of light emitted from the semiconductor device package may be enhanced.

The lens part 261 including the curved part R may vertically overlap at least four external corners of a plurality of polygonal corners. The corners may each denote a vertex at which external polygonal sides contact each other. The curved part R may vertically overlap at least four outer surfaces of outer surfaces of the first electrode unit 210 or the second electrode unit 220. The insulating reflection layer 230 may not protrude outward from the curved part R of the lens part 261.

One or more polygonal vertexes 230p may vertically overlap a virtual straight line LP, circumscribing a curved surface of the lens part 261 of the optical lens 260, in a region LR where the virtual straight line LP contacts the substrate 201. An angle "θ" between the substrate 201 and the virtual straight line LP circumscribing the curved surface of the lens part 261 may be about 60 degrees to about 90 degrees. When the angle "θ" is 60 degrees or more, it may be easy to control a directional angle of light emitted from the semiconductor device package. When the angle "θ" is 90 degrees or less, an area where the lens part 261 contacts the insulating reflection layer 230 may be widened, thereby enhancing light extraction efficiency.

A semiconductor device package according to embodiments disclosed herein may include a substrate 201; a first electrode unit 210 provided on the substrate 201; a light emitting device 100 provided in a first region 201a of the first electrode unit 210; a second electrode unit 220 electrically disconnected from the first electrode unit 210 and provided on the substrate 201; and an insulating reflection layer 230 provided between the first electrode unit 210 and the second electrode unit 220. The lens part 261 may be provided on the insulating reflection layer 230, and the insulating reflection layer 230 may not protrude outward from a lower surface of the lens part 261.

A semiconductor device package according to embodiments may include a substrate 201; a first electrode unit 210 provided on the substrate 201; a second electrode unit 220 electrically disconnected from the first electrode unit 210 and provided on the substrate 201; and an insulating reflection layer 230 provided between the first electrode unit 210 and the second electrode unit 220.

The first electrode unit 210 may include an A area including a first region 210a where the light emitting device 100 and a fifth region 210b extending from the first region 210a to a first axis X, a B area that includes a second region 210d where a protection device 105 may be provided and a first connection part 210f extending in a direction from the second region 210d to the first axis X and provided on one side of the A area, and a C area having a width that corresponds to a second axis (Y) direction vertical to the first axis (X) direction and increasingly widens in a direction toward a lower corner of the substrate.

A semiconductor device package according to embodiments disclosed herein may include a substrate, a first electrode unit provided on the substrate, a light emitting device provided in a first region of the first electrode unit, a second electrode unit electrically disconnected from the first electrode unit and provided on the substrate, and an insulating reflection layer provided on a circumference of the light emitting device between the first electrode unit and the second electrode unit and including a polygonal shape. A lighting device according to embodiments may include a light emitting unit including the semiconductor device package.

In the description of embodiments, it may be understood that when a layer (or film) is referred to as being 'on' another layer or substrate, it may be directly on another layer or substrate, or intervening layers may also be present. Further, it may be understood that when a layer is referred to as being 'under' another layer, it may be directly under another layer, and one or more intervening layers may also be present. It may also be understood that when a layer is referred to as being 'between' two layers, it may be the only layer between the two layers, or one or more intervening layers may also be present.

When an element or layer is referred to as being "on" another element or layer, the element or layer may be directly on another element or layer or intervening elements or layers. In contrast, when an element is referred to as being "directly on" another element or layer, there may be no intervening elements or layers present. As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present disclosure.

Spatially relative terms, such as "lower", "upper" and the like, may be used herein for ease of description to describe the relationship of one element or feature to another element(s) or feature(s) as illustrated in the figures. The spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. The terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this disclosure belongs. Terms, such as those defined in commonly used dictionaries, should be interpreted as having a meaning that is consistent with their meaning in the context of the relevant art and not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device package comprising:
   a substrate;
   a first electrode module provided on the substrate;
   a second electrode module electrically disconnected from the first electrode module and provided on the substrate;
   a light emitting device provided on the first electrode module;
   an insulating reflection layer provided between the first electrode module and the second electrode module; and
   an optical lens provided on the insulating reflection layer,
   wherein an upper surface of the insulating reflection layer is provided in a polygonal shape having a plurality of vertexes including:
   at least one first point where a distance to a center of the substrate is within a first range; and
   an angle between an upper surface of the substrate and a contact line circumscribing the optical lens is 60 degrees to 90 degrees,
   wherein the at least one first point vertically overlaps a line that connects an external contact point between the contact line and the optical lens to a point at which the contact line contacts the substrate.

2. The semiconductor device package of claim 1, wherein the optical lens includes a lens part and a curvature part, and curvature directions of the lens part and the curvature part differ.

3. The semiconductor device package of claim 2, wherein the first point vertically overlaps the curvature part.

4. The semiconductor device package of claim 1, wherein the plurality of vertexes of the insulating reflection layer include the first point and a second point where a distance to a center of the insulating reflection layer is less than the first range.

5. The semiconductor device package of claim 4, wherein the second electrode module includes a first protrusion and a second protrusion that protrude in a direction from an outer surface of the second electrode module to the light emitting device.

6. The semiconductor device package of claim 5, wherein a vertical width of each of the first protrusion and the second protrusion is constant.

7. The semiconductor device package of claim 6, wherein a first distance, which is a vertical distance between a first region, where the light emitting device is provided, of the first electrode module and the first protrusion or the second protrusion of the second electrode module, is within a range of 1/10 to 3/10 of a width of the first region in a first axis direction.

8. The semiconductor device package of claim 5, wherein the first electrode module includes:
   a third region provided in a lower corner region of the first electrode module;
   a fourth region provided in an upper corner region of the first electrode module; and
   a fifth region provided between the first region and each of the third and second regions.

9. The semiconductor device package of claim 8, wherein the second electrode module includes a first connector provided in the second region and the upper corner region of the first electrode module, and a vertical width of the first connector is less than a vertical width of the second region.

10. The semiconductor device package of claim 9, wherein the second electrode module includes a fourth protrusion provided in a lower corner region of the second electrode module and a fifth protrusion provided in an upper corner region of the second electrode module, the fourth protrusion corresponds to the third region of the first electrode module, and the fifth protrusion corresponds to the fourth region of the first electrode module.

11. The semiconductor device package of claim 10, wherein the insulating reflection layer is provided between the fourth protrusion and the third region and electrically disconnects the second electrode module from the first electrode module.

12. The semiconductor device package of claim 11, wherein the insulating reflection layer is provided between the fifth protrusion and the fourth region and electrically disconnects the second electrode module from the first electrode module.

13. The semiconductor device package of claim 12, wherein the insulating reflection layer includes:

a first separation region provided between the fifth protrusion of the second electrode module and the fourth region of the first electrode module, the first separation region being an electrode separation region; and a second separation region provided between the fourth protrusion of the second electrode module and the third region of the first electrode module, the second separation region being an electrode separation region.

14. The semiconductor device package of claim 1, wherein the insulating reflection layer does not vertically overlap the first electrode module and the second electrode module.

15. The semiconductor device package of claim 9, wherein a width of the second region of the first electrode module in a first axis direction is 1/5 to 2/5 of a width of the first region of the first electrode module in the first axis direction.

16. The semiconductor device package of claim 9, wherein a length and a width of the first connector are set less than a length and a width of the fifth region of the first electrode module.

17. The semiconductor device package of claim 1, further comprising: a resin reflection layer provided on a side circumference of the light emitting device.

18. The semiconductor device package of claim 17, wherein the light emitting device includes a light emitting chip and a phosphor layer provided on the light emitting chip, and the resin reflection layer is provided on a side surface of the light emitting chip and a side surface of the phosphor layer.

19. The semiconductor device package of claim 17, wherein a portion of the resin reflection layer is provided along a side surface of the light emitting device and is provided more inward than an outer surface of the phosphor layer.

20. A semiconductor device package comprising:
a substrate;
a first electrode module provided on the substrate;
a second electrode module separated from the first electrode module and provided on the substrate; and
an insulating reflection layer provided between the first electrode module and the second electrode module,
wherein the first electrode module includes:
a first electrode extension provided outside the first electrode module with respect to a first axis to extend a second axis direction vertical to the first axis;
a first region separated from the first electrode extension in a third axis direction opposite to the first axis, a light emitting device being provided in the first region;
a second region separated from the first electrode extension in a first axis direction and separated from the first region in the second axis direction vertical to the first axis direction, a protection device being provided in the second region;
a first connector provided between the first region and the first electrode extension to electrically connect the first region to the first electrode extension; and
a second connector provided between the second region and the first electrode extension to electrically connect the second region to the first electrode extension,
wherein the first electrode extension includes:
a first vertical part provided in parallel with the second axis direction between the first connector and the second connector;
a first diagonal part provided between the first vertical part and the second connector to have a width that corresponds to the first axis direction and increases progressively closer to the second axis direction;
a first protrusion separated from the second region in the second axis direction, provided outside the first electrode module with respect to a second axis, connected to the first diagonal part, and provided to protrude in the first axis direction;
a second protrusion provided outside the first region in a fourth axis direction opposite to the second axis direction; and
a second diagonal part provided between the second protrusion and the first vertical part of the first electrode extension to have a width that corresponds to the first axis direction and increases progressively closer to the fourth axis direction,
wherein the second electrode module includes:
a second electrode extension provided outside the second electrode module in the third axis direction to extend in the second axis direction;
a first bonding part provided in the first axis direction to have a region overlapping the first region and connected to the second electrode extension;
a second bonding part provided in the first axis direction to have a region overlapping the first region, separated from the first bonding part in the second axis direction, and connected to the second electrode extension;
a third bonding part provided in the first axis direction to have a region overlapping the second region and connected to the second electrode extension;
a third protrusion provided to extend in the first axis direction, separated from the third bonding part in the second axis direction, and connected to the second electrode extension; and
a fourth protrusion provided to extend in the first axis direction, separated from the second bonding part in the fourth axis direction, and connected to the second electrode extension, and
wherein the second electrode extension part includes:
a second vertical part provided in parallel with the second axis direction between the first bonding part and the second bonding part;
a third diagonal part provided between the third protrusion and the second vertical part to have a width that corresponds to the first axis direction and increases progressively closer to the second axis direction; and
a fourth diagonal part provided between the fourth protrusion and the second vertical part to have a width that corresponds to the first axis direction and increases progressively closer to the fourth axis direction.

* * * * *